United States Patent
Lee

(10) Patent No.: US 8,014,221 B2
(45) Date of Patent: *Sep. 6, 2011

(54) MEMORY DEVICES INCLUDING FLOATING BODY TRANSISTOR CAPACITORLESS MEMORY CELLS AND RELATED METHODS

(75) Inventor: Yeong-Taek Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 580 days.

This patent is subject to a terminal disclaimer.

(21) Appl. No.: 11/546,403

(22) Filed: Oct. 12, 2006

(65) Prior Publication Data

US 2007/0127289 A1  Jun. 7, 2007

(30) Foreign Application Priority Data

Dec. 7, 2005 (KR) .................. 10-2005-0118907

(51) Int. Cl.
*G11C 7/00* (2006.01)

(52) U.S. Cl. .................. 365/210.1; 365/207

(58) Field of Classification Search .............. 365/185.2, 365/176, 184, 189.07, 190, 208, 210.1, 230.04, 365/207

See application file for complete search history.

(56) References Cited

U.S. PATENT DOCUMENTS

| | | | | |
|---|---|---|---|---|
| 4,807,194 A | * | 2/1989 | Yamada et al. | ............. 365/207 |
| 5,029,138 A | * | 7/1991 | Iwashita | ............. 365/185.21 |
| 5,608,674 A | * | 3/1997 | Yabe et al. | ............. 365/189.05 |
| 6,111,778 A | | 8/2000 | MacDonald et al. | |
| 6,519,174 B2 | * | 2/2003 | Kirihata et al. | ............. 365/69 |
| 6,538,916 B2 | | 3/2003 | Ohsawa | |
| 6,567,330 B2 | | 5/2003 | Fujita et al. | |
| 6,781,875 B2 | | 8/2004 | Ohsawa | |
| 6,825,524 B1 | | 11/2004 | Ikehashi et al. | |
| 6,882,008 B1 | | 4/2005 | Ohsawa | |
| 6,903,984 B1 | | 6/2005 | Tang et al. | |
| 7,388,798 B2 | * | 6/2008 | Kim et al. | ............. 365/210.1 |
| 7,433,223 B2 | * | 10/2008 | Kim et al. | ............. 365/149 |
| 2003/0231521 A1 | | 12/2003 | Ohsawa | |
| 2003/0231524 A1 | | 12/2003 | Ohsawa | |
| 2004/0262693 A1 | | 12/2004 | Ohsawa | |
| 2005/0041457 A1 | | 2/2005 | Forbes | |
| 2005/0063224 A1 | | 3/2005 | Fazan et al. | |
| 2005/0068807 A1 | | 3/2005 | Ohsawa | |

FOREIGN PATENT DOCUMENTS

CN   00803360   3/2002

(Continued)

OTHER PUBLICATIONS

Office Action With English Translation of Chinese Patent Application No. 200610164262.7 Dated Jan. 9, 2009.

(Continued)

*Primary Examiner* — VanThu Nguyen
*Assistant Examiner* — Douglas King
(74) *Attorney, Agent, or Firm* — Volentine & Whitt, PLLC

(57) ABSTRACT

A semiconductor memory device includes a memory cell array which includes a plurality of unit memory cells, where each of the unit memory cells comprises complementary first and second floating body transistor capacitor-less memory cells. A logic value written into and read from each unit memory cell is defined by a difference in threshold voltage states of the first and second floating body transistor capacitorless memory cells.

4 Claims, 12 Drawing Sheets

FOREIGN PATENT DOCUMENTS

| | | |
|---|---|---|
| CN | 1339160 A | 3/2002 |
| CN | 1628386 | 6/2005 |
| EP | 1150302 | 10/2001 |
| WO | WO 2005/029499 A2 | 3/2005 |

OTHER PUBLICATIONS

Allowance Deicsion and Search Report of Taiwan Patent Application No. 095142625 Dated Jan. 19, 2009.

S. Okhonin et al., "A Capacitor-Less 1T-DRAM Cell," IEEE Electron Device Letters, vol. 23, No. 2, Feb. 2002, pp. 85-87.

T. Ohsawa et al., "Memory Design Using a One-Transistor Gain Cell on SOI," IEEE Journal of Solid-State Circuits, vol. 37, No. 11, Nov. 2002, pp. 1510-1522.

Office Action corresponding to Chinese Patent Application dated Dec. 6, 2010 with English Translation.

* cited by examiner

MEMORY DEVICES INCLUDING FLOATING BODY TRANSISTOR CAPACITORLESS MEMORY CELLS AND RELATED METHODS

BACKGROUND OF THE INVENTION

1. Field of the Invention

The present invention generally relates to semiconductor memory devices, and more particularly, the present invention relates to semiconductor memory devices which include floating body capacitorless memory cells and to methods of operating such devices.

A claim of priority is made to Korean Patent Application No. P2005-0118907, filed Dec. 7, 2006, the entirety of which is incorporated herein by reference.

2. Description of the Related Art

Typically, the memory cells of dynamic random access memory (DRAM) devices are composed of a capacitor for storing charges and a transistor for accessing the capacitor. A logic value of each memory cell is determined by a voltage of the capacitor. However, in an effort to increase device integration, DRAM memory cells composed of a single transistor have been proposed. These single-transistor type memory cells are referred to herein as "floating body transistor capacitorless memory cells", and in some instances, the short-hand phrase "transistor cell" is utilized.

In a write mode, the threshold voltage of a floating body transistor capacitorless memory cell is varied by altering the channel body potential of the cell, and in a read mode, logic states are discriminated based on an amount of current passing through the cell. This is explained in more detail below with reference to FIG. 1.

FIG. 1 is a cross-sectional schematic view of an example of a floating body transistor capacitorless memory cell. As shown, the floating body transistor capacitorless memory cell of this example includes a silicon (Si) substrate 100 and a buried oxide layer 101. Located over the buried oxide layer 101 is a floating channel body region 102 interposed between source and drain regions 103 and 104. A gate dielectric 105 and gate electrode 106 are aligned over a floating channel body region 102, and insulating layers 107 (e.g., $SiO_2$ layers) are formed to isolate the floating body transistor capacitorless memory cell from other devices on the substrate 100.

Logic "1" and "0" states are dependent upon the threshold voltage Vth of the floating body transistor capacitorless memory cell, and examples of write and read voltages applied to the floating body transistor capacitorless memory cell are illustrated below in Table 1:

TABLE 1

| | Threshold (Vth) | Source (Vs) | Gate (Vg) | Drain (Vd) |
|---|---|---|---|---|
| Write "1" | Low | 0 V | 1.5 V | 1.5 V |
| Write "0" | High | 0 V | 1.5 V | −1.5 V |
| Read | n/a | 0 V | 1.5 V | 0.2 V |

In a write data "1" operation, a voltage bias condition is set in which Vgs>Vth and Vgd<Vth. This causes the transistor cell to operate in a saturation region. In this state, impact ionization occurs at the junction between the drain region 104 and the floating channel body region 102. As a result, holes are injected in the floating channel body region 102. This increases the potential of the floating channel body region 102 and reduces the threshold voltage Vth of the floating body transistor capacitorless memory cell.

In a write data "0" operation, the drain voltage Vd is dropped to a negative voltage to create a forward bias condition at the junction between the floating channel body region 102 and the drain region 104. The forward bias causes holes contained in the floating channel body region 102 to migrate into the drain region 104. This reduces the potential of the floating channel body region 102 and increases the threshold voltage Vth.

In a read operation, a voltage bias condition is set such that Vgs>Vth and Vgd>Vth, and such that the transistor cell is operated in its linear region. A drain current is measured and compared to a reference cell current to thereby distinguish whether the floating body transistor capacitorless memory cell is in a high (logic "0") or low (logic "1") voltage threshold Vth state. More particularly, if the measured drain current is less than the reference current, then a logic "0" state is read. If the measured drain current is more than the reference current, then a logic "1" state is read.

Conventionally, the reference cell current is generated using reference (or dummy) transistor cells which are respectively programmed to "0" and "1" states. In addition, a reference voltage generating circuit and other circuits are utilized to generate a reference current which lies between the drain currents of the "0" and "1" reference transistor cells. See, for example, U.S. Pat. No. 6,567,330, issued May 20, 2003, in the name of Fujita et al.

The reading of floating body transistor capacitorless memory cells is prone to a variety of errors. Examples of such errors are described next with reference to FIGS. 2A through 2C.

FIGS. 2A and 2B shows "0" state and "1" state drain current distributions 201 and 202 of a number of floating body transistor capacitorless memory cells, and reference cell current distributions 203 associated with multiple read operations. FIG. 2A illustrates the case where the reference cell current distribution 203 and the "0" state drain current distribution 201 overlap at 210, and FIG. 2B illustrates the case where the reference cell current distribution 203 and the "1" state drain current distribution 202 overlap at 211. In either case, read errors will occur. The overlap conditions 210 and 211 of FIGS. 2A and 2B can result from a number of factors, including process variations, temperature variations, and so on.

FIG. 2C shows the case where the transistor cell "0" state and "1" state drain current distributions 201 and 202 overlap one another at 212. This can result from the volatile nature of floating body transistor capacitorless memory cells. That is, leakage from the floating channel body region can cause the threshold voltages Vth of the cell transistors to drift. It is therefore necessary to periodically refresh floating body transistor capacitorless memory cells much in the same way that conventional capacitor-type DRAM cells are refreshed.

In addition to the propensity for reading errors described above, the conventional floating body transistor capacitorless memory cell DRAM device suffers the drawback of requiring the provision of a reference current generator, reference memory cells and other circuits to generate the reference current. These can prove burdensome when attempting to increase the density of the memory device. Also, additional time is consumed in a refresh operation to refresh the reference memory cells.

SUMMARY OF THE INVENTION

According to an aspect of the present invention, a semiconductor memory device is provided which includes a memory cell array which includes a plurality of unit memory cells, where each of the unit memory cells comprises complementary first and second floating body transistor capacitor-less memory cells.

According to another aspect of the present invention, a semiconductor memory device is provided which includes a memory cell array including a plurality of unit memory cells arranged in rows and columns, where each of the unit memory cells comprises complementary first and second floating body transistor capacitor-less memory cells. The memory device further includes a plurality of odd bit line pairs connected to respective odd rows of the unit memory cells, where each odd bit line pair includes a first odd bit line connected to the first floating body transistor capacitor-less memory cell of each respective odd row, and a second odd bit line connected to the second floating body transistor capacitor-less memory cells of each respective odd row. The memory device further includes a plurality of even bit line pairs connected to respective even rows of the unit memory cells, wherein each even bit line pair includes a first even bit line connected to the first floating body transistor capacitor-less memory cells of each respective even row, and a second even bit line connected to the second floating body transistor capacitor-less memory cells of each respective even row. The memory device further includes odd and even sensing circuits, odd and even sense bit line pairs operatively coupled to the odd and even sensing circuits, respectively, an odd bit line selector which selectively couples a selected odd bit line pair among the plurality of odd bit line pairs to the odd sense bit line pair, and an even bit line selector which selectively couples a selected even bit line pair among the plurality of even bit line pairs to the even sense bit line pair.

According to yet another aspect of the present invention, a semiconductor memory device is provided which includes a memory cell array including a plurality of unit memory cells, where each of the unit memory cells comprises a first floating body transistor capacitor-less memory cell located in a first memory block array, and a complementary second floating body transistor capacitor-less memory cell located in a second memory block array. The memory device further includes a plurality of first bit lines operatively coupled to corresponding first floating body transistor capacitor-less memory cells located in the first memory block array, and a plurality of second bit lines operatively connected to corresponding second floating body transistor capacitor-less memory cells located in the second memory block array. The memory device further includes a sensing circuit operatively located between the first and second memory block arrays, a sense bit line pair operatively coupled to the sensing circuit, a first bit line selector which selectively couples a first bit line among the plurality of first bit lines to one of the sense bit line pair, and a second bit line selector which selectively couples a second bit line among the plurality of second bit lines to the other of the sense bit line pair.

According to still another aspect of the present invention, a method is provided of writing data into semiconductor memory device which includes floating body transistor capacitorless memory cells. The method includes setting a threshold voltage of a first floating body transistor capacitor-less memory cell to a first threshold voltage, and setting a threshold voltage of a second floating body transistor capacitorless memory cell to a second threshold voltage. The first and second floating body transistor capacitorless memory cells constitute a unit memory cell, and a logic value written into each unit memory cell is defined by a difference in the first and second threshold voltages of the first and second floating body transistor capacitorless memory cells.

According to yet another aspect of the present invention, a method is provided of reading data of a semiconductor memory device which includes floating body transistor capacitorless memory cells. The method includes determining a threshold voltage state of a first floating body transistor capacitorless memory cell, and determining a threshold voltage state of a second floating body transistor capacitorless memory cell. The wherein the first and second floating body transistor capacitorless memory cells constitute a unit memory cell, and the method further includes determining a logic value of each unit memory cell according to a difference in the first and second threshold voltage states of the first and second floating body transistor capacitorless memory cells.

BRIEF DESCRIPTION OF THE DRAWINGS

The above and other aspects and features of the present invention will become readily apparent from the detailed description that follows, with reference to the accompanying drawings, in which.

DETAILED DESRIPTION OF EMBODIMENTS

Figure 1:
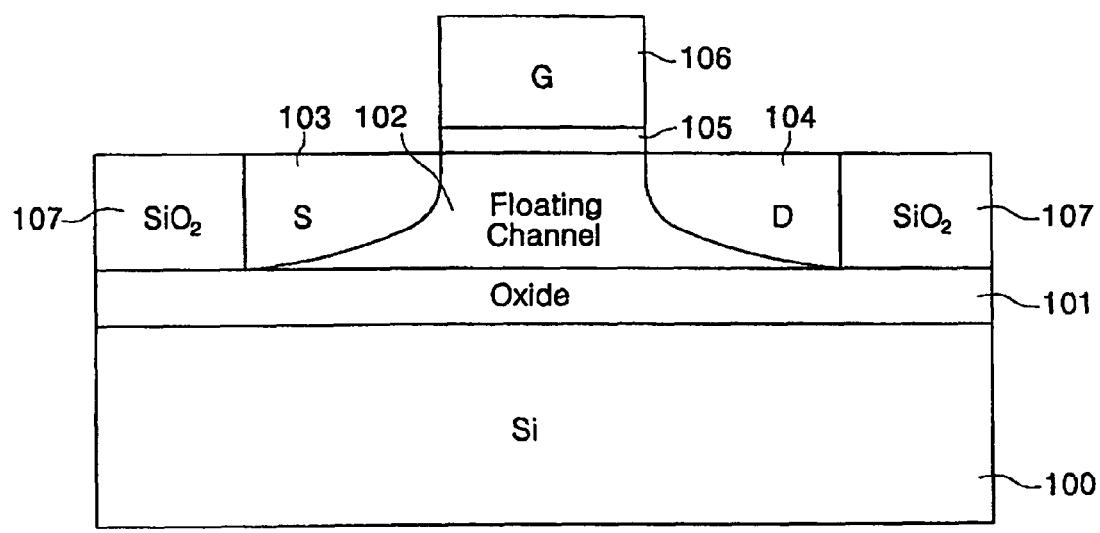
FIG. 1 is cross-sectional view of a conventional floating body transistor capacitorless memory cell.
Figure 2A:
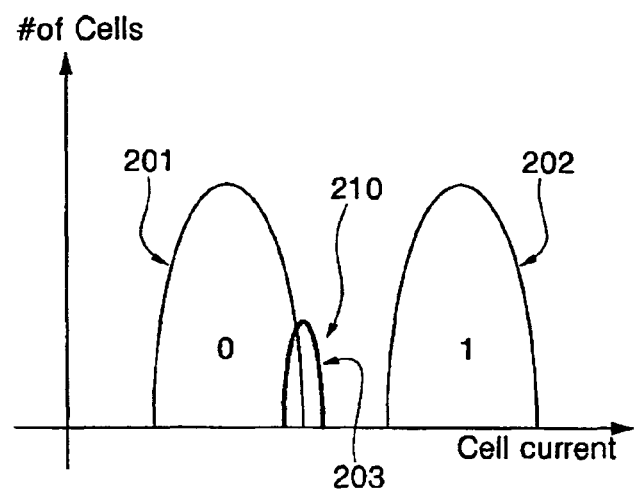
FIGS. 2A through 2C are graphs showing cell current distributions of conventional floating body transistor capacitorless memory cells.
Figure 2B:
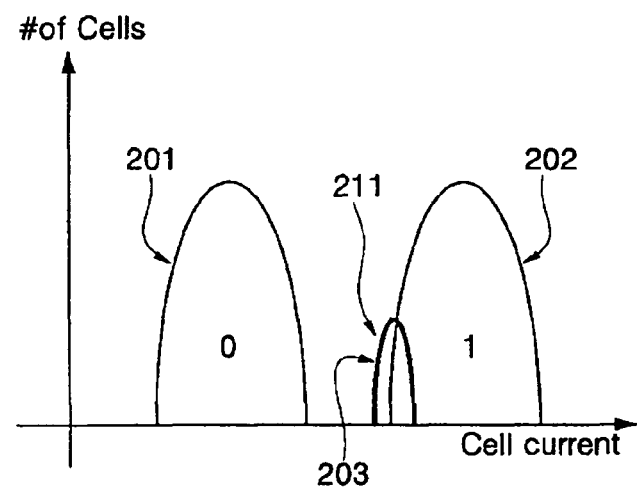
Figure 2C:
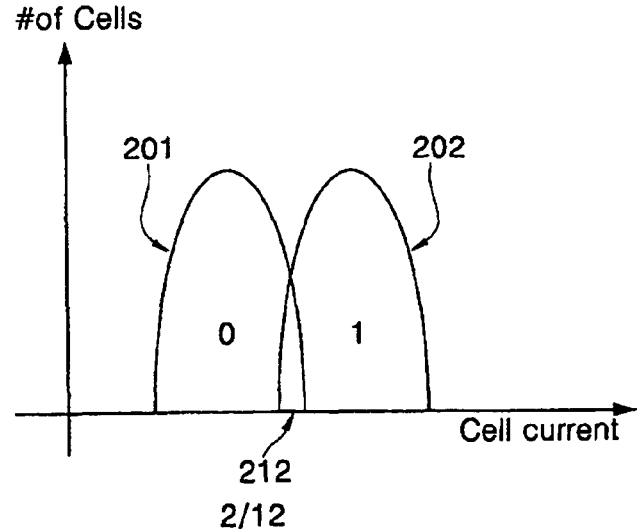

The invention is described more fully hereinafter with reference to the accompanying drawings, in which exemplary embodiments of the present invention are shown. The present invention may, however, be embodied in many different forms and should not be construed as limited to the examples set forth herein. In the drawings, the sizes and relative sizes of layers and regions may be exaggerated and/or simplified for clarity. Also, it will be understood that when an element or layer is referred to as being "on", "connected to" or "coupled to" another element or layer, it can be directly on, connected or coupled to the other element or layer, or intervening elements or layers may be present.

The present invention will now be described by way of preferred, but non-limiting, embodiments of the invention.

Figure 3:
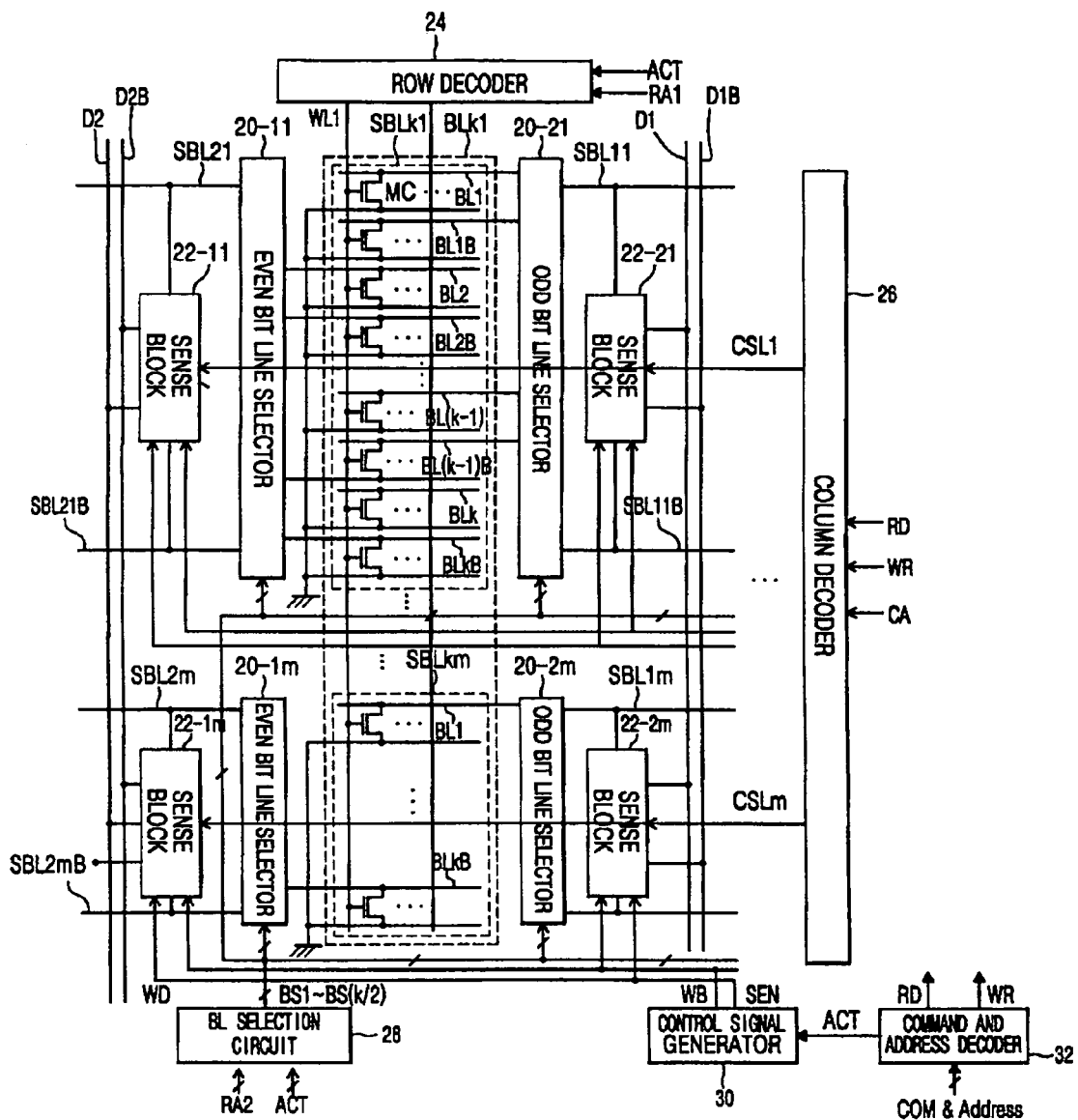
FIG. 3 is a block diagram of a floating body transistor capacitorless memory cell memory device according to an embodiment of the present invention.

FIG. 3 is a block diagram of floating body transistor capacitorless memory cell memory device according to an embodiment of the present invention.

The memory device of FIG. 3 includes a memory cell array block BLK1 containing a plurality of sub-array blocks SBLK<1:m>, a plurality of even and odd bit line (BL) selectors 21-1<1:m> and 20-2<1:m>, a plurality of sense blocks 22-1<1:m> and 22-2<1:m>, a row decoder 24, a column decoder 26, a bit line selection signal generator 28, a control signal generator 30, and a command decoder 32.

Each sub-array block SBLK of the memory cell array block BLK1 contains a plurality of floating body transistor capacitorless memory cells MC. It should be noted that a single memory cell array block BLK1 is illustrated in FIG. 3 for simplicity, and that the memory device includes multiple blocks BLK of the same configuration.

As mentioned above, each memory cell array block BLK1 includes a plurality of sub-array blocks SBLK<1:m>. The sub-array blocks SBLK<1:m> share the same word lines WL. In FIG. 3, only a single word line WL1 is shown for simplicity.

Each sub-array block SBLK includes a plurality of bit lines BL<1:k> and a plurality of complementary bit lines BLB<1:k>. The bit lines BL<1:k> and complementary bit lines BLB<1:k>are alternately arranged as shown in FIG. 3. Each bit line BL and its complementary bit line BLB are collectively referred to herein as a "bit line pair" BL/BLB. Accordingly, in the example of this embodiment, there are "k" bit line pairs BL/BLB per sub-array block SBLK.

A "unit memory cell" is defined in this embodiment by a first floating body transistor capacitorless memory cell connected between a bit line BL and a reference potential (e.g., ground), and a second floating body transistor capacitorless memory cell connected between a complementary bit line BLB and the reference potential. The unit memory cell stores a logic value as indicated by complementary threshold voltage states of the first and second floating body transistor capacitorless memory cells. That is, each of the unit memory cells includes complementary first and second floating body transistor capacitor-less memory cells having opposite threshold voltage states. In the example of this embodiment, the floating body transistor capacitorless memory cells are NMOS type transistors.

The complementary first and second floating body transistor capacitor-less memory cells of each unit memory cell are gated to the same word line WL.

The even bit line selectors 20-1<1:m> and odd bit line selectors 20-2<1:m> are located on opposite sides of the respective sub-array blocks SBLK<1:m>. Each even bit line selector 20-1 is connected to the k/2 even numbered bit lines BL and to the k/2 even numbered complementary bit lines BLB of the respective sub-array block SBLK. Likewise, each odd bit line selector 20-2 is connected to the k/2 odd numbered bit lines BL and to the k/2 odd numbered complementary bit lines BLB of the respective sub-array block SBLK.

Still referring to FIG. 3, the sense blocks 22-1<1:m> are connected to the respective even bit line selectors 20-1<1:m>, and the sense blocks 22-2<1:m> are connected to the respective odd bit line selectors 20-2<1:m>. In particular, complementary sense bit lines SBL1<1:m> and SBL1B<1:m> are connected between each odd bit line selector 20-2<1:m> and it corresponding sense block 22-1<1:m>. Similarly, complementary sense bit lines SBL2<1:m> and SBL2B<1:m> are connected between each even bit line selector 20-1<1:m> and it corresponding sense block 22-1<1:m>.

Examples of the even and odd bit line selectors 20-1 and 20-2 and the sense blocks 22-1 and 22-2 will be described in greater detail later herein.

The command decoder 32 generates an active command ACT, a read command RD, and a write command WD in response to a command signal COM.

The row decoder 24 is responsive to the active command ACT to decode a first row address RA1 to activate a corresponding one of the word lines WL.

The bit line selection signal generator 28 is responsive to the active command ACT to decode a second row address RA2 to activate one of bit line selection signals BS<1:k/2>. (As noted previously, "k" is the number of bit line pairs BL/BLB per sub-array block SBLK.) The bit line selection signals BS<1:k/2> are applied to the even and odd bit line selectors 20-1<1:m> and 20-2<1:m> as shown in FIG. 3.

The column decoder 26 is responsive to the read and write command RD and WR to decode a column address CA to activate a corresponding one or more of the column selection signals CSL<1:m>. The column selection signals CSL<1:m> are applied to the respective sense blocks 22-1<1:m> and to the respective sense blocks 22-2<1:m> as shown in FIG. 3.

The control signal generator 30 is responsive to the active command ACT to selectively activate a sense amplifier enable signal SEN and a write back signal WB. In particular, the write back signal WB is activated a predetermined time after the sense amplifier enable signal SEN is activated. As shown in FIG. 3, these signals are applied to the sense blocks 22-1<1:m>and 22-2<1:m>.

Also depicted in FIG. 3 are first complementary data lines D1 and D1B, and second complementary data lines D2 and D2B. The first complementary data lines D1 and D1B are connected to the sense blocks 22-2<1:m>, and the second complementary data lines D2 and D2B are connected to the sense blocks 22-1<1:m>.

Those skilled in the art will be well-acquainted with various possibilities for constructing the row decoder 24, column decoder 26, bit line selection circuit 28, control signal generator 30, and command decoder 32. Accordingly, examples of detailed circuit configurations of these components are omitted here for the sake of brevity.

An example of the odd and even bit line selectors 20-1 and 20-2 of FIG. 3 will be described next with reference to FIGS. 4A and 4B. In particular, FIG. 4A is a circuit diagram showing an example of an even bit line selector 20-1, and FIG. 4B is a circuit diagram showing an example of an odd bit line selector 20-2.

Figure 4A:
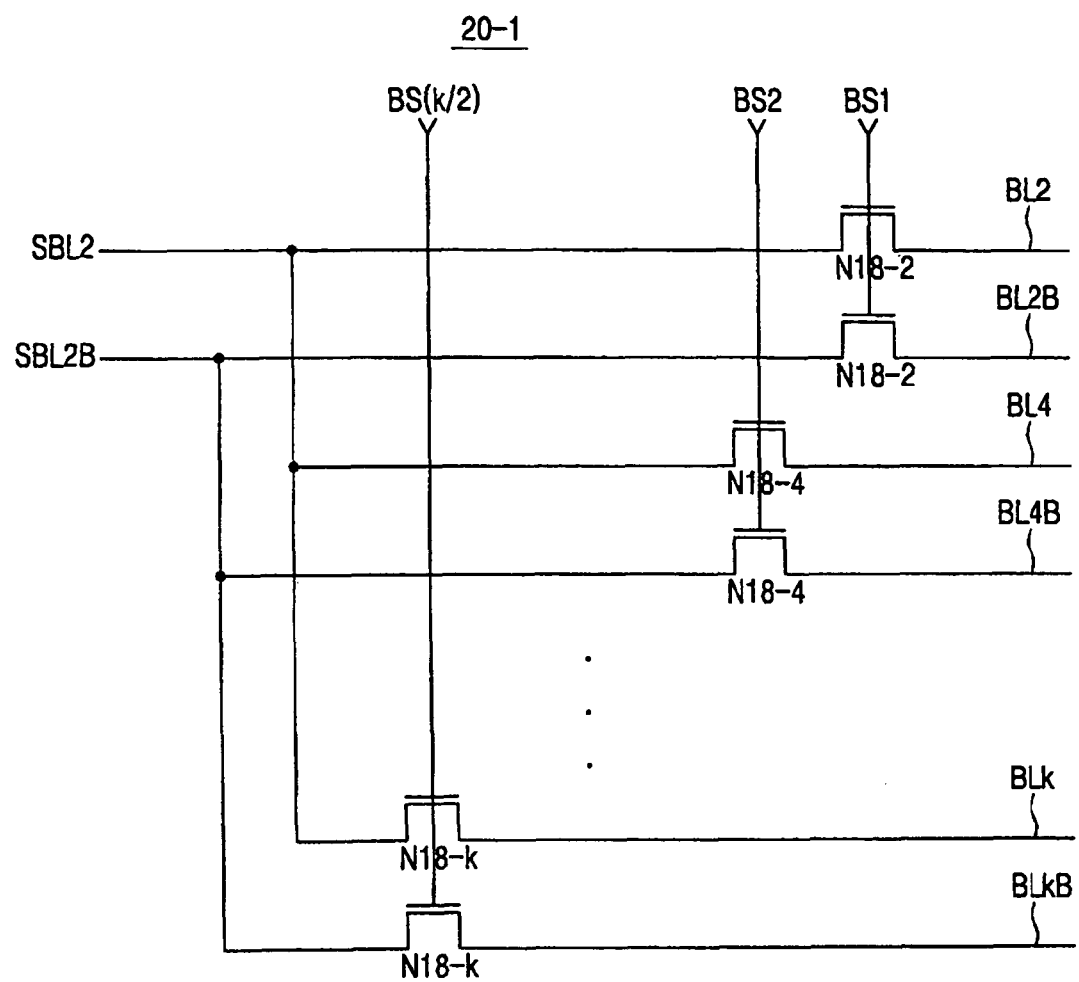
FIGS. 4A and 4B are circuit diagrams of even and odd bit line selectors, respectively, according to embodiments of the present invention.

As shown in FIG. 4A, the even bit line selector of this example includes even numbered NMOS transistor pairs N18-2, N18-4, ..., N18-k connected between respective even numbered bit line pairs BL2/BLB2, BL4/BLB4, ..., BLk/BLBk, and the complementary sense bit lines SBL2/SBL2B. As noted previously, the complementary sense bit lines SBL2/SBL2B are connected to a corresponding sense block 22-1. The even numbered NMOS transistor pairs N18-2, N18-4, ..., N18-k are respectively gated to the bit line selection signals BS<1:k/2>. As explained previously, the bit line selection signals BS<1:k/2> are generated by the bit line selection signal generator 28. The even bit line selector of FIG. 4A is responsive to the bit line selection signals BS<1:k/2> to selectively connect any one of the even numbered bit line pairs BL2/BLB2, BL4/BLB4, ..., BLk/BLBk to the complementary sense bit lines SBL2/SBL2B.

Figure 4B:
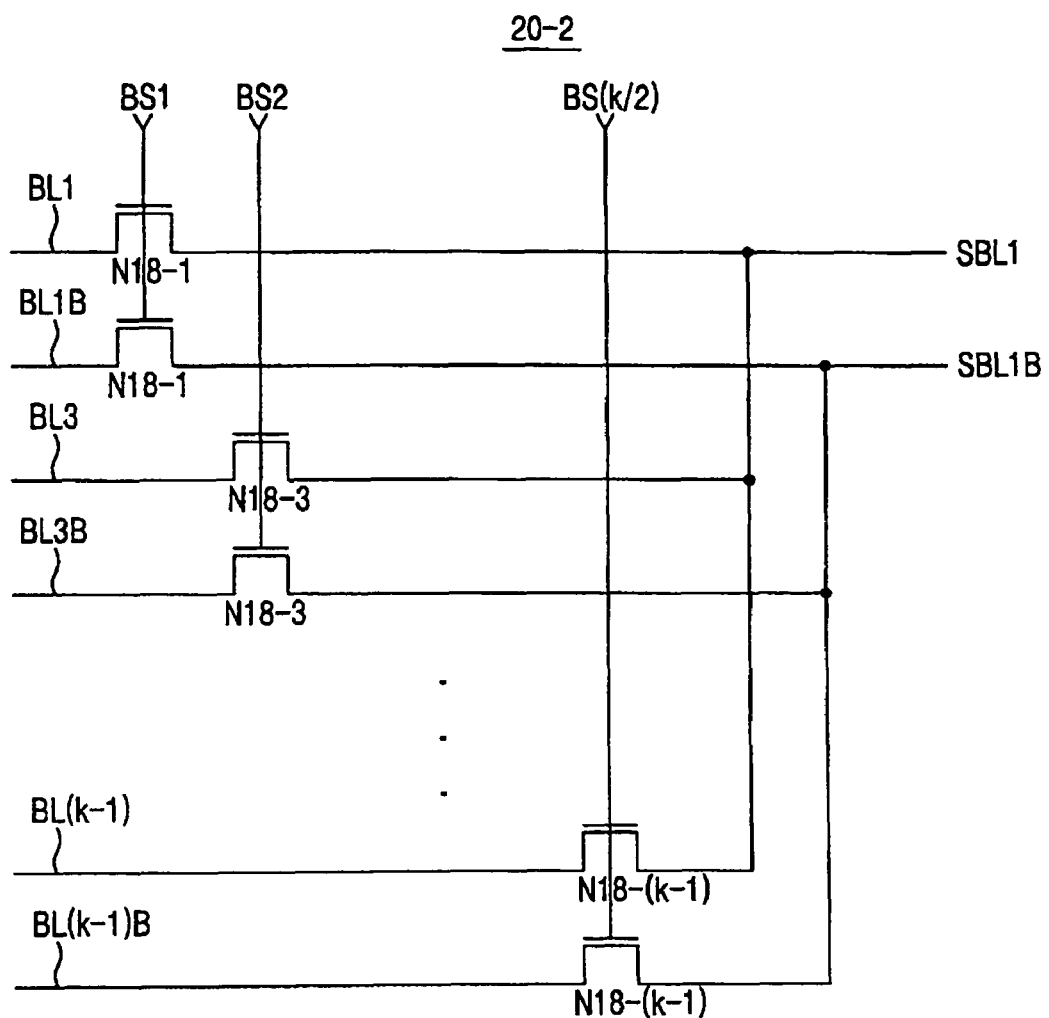

The odd numbered bit line selector of FIG. 4B includes odd numbered NMOS transistor pairs N18-1, N18-4, ..., N18-(k-1) connected between respective odd numbered bit line pairs BL1/BLB1, BL3/BLB3, ..., BL(k-1)/BLB(k-1), and the complementary sense bit lines SBL1/SBL1B. As noted previously, the complementary sense bit lines SBL1/SBL1B are connected to a corresponding sense block 22-2. The odd numbered NMOS transistor pairs N18-1, N18-3, ..., N18-(k-1) are respectively gated to the bit line selection signals BS<1:k/2> generated by the bit line selection signal generator 28. The odd bit line selector of FIG. 4B is responsive to the bit line selection signals BS<1:k/2> to selectively connect any one of the odd numbered bit line pairs BL1/BLB1, BL3/BLB3, ..., BL(k-1)/BLB(k-1) to the complementary sense bit lines SBL1/SBL1B.

Figure 5:
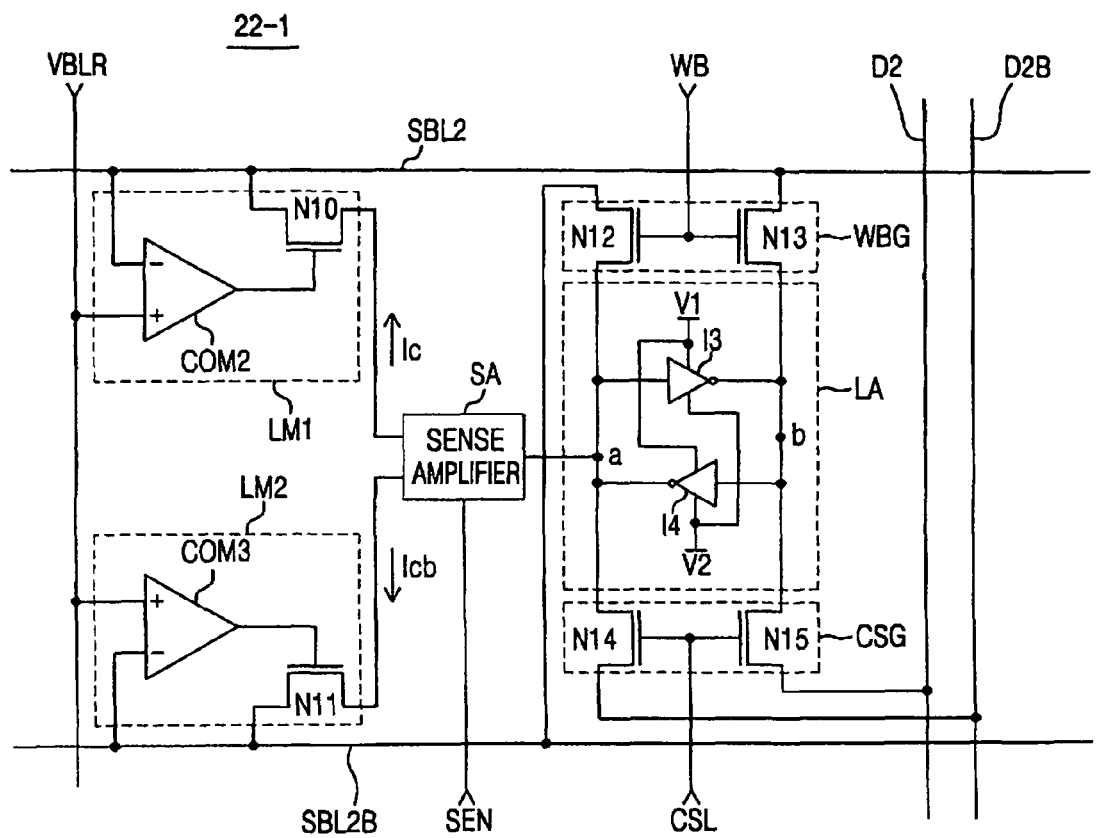
FIG. 5 is a circuit diagram of a sense block according to an embodiment of the present invention.

FIG. 5 is a circuit diagram showing an example of one of the sense blocks 22-1<1:m> of FIG. 3. The sense blocks 22-2<1:m> of FIG. 3 are each similarly configured, and accordingly, a detailed description thereof is omitted here to avoid redundancy.

As shown in FIG. 5, the sense block 22-1 is connected between the complementary sense bit lines SBL2/SBL2B (see FIGS. 3 and 4), and includes level limiters LM1 and LM2, a sense amplifier SA, a write back gate WBG, a latch LA, and a column selection gate CSG.

The level limiter LM1 includes a comparator COM2 which compares a voltage of the sense bit line SBL2 with a restriction voltage VBLR, and an NMOS transistor N10 which is responsive to the output of the comparator COM2 to restrict the voltage of the sense bit line SBL2 to not exceed the restriction voltage VBLR. Similarly, the level limiter LM2 includes a comparator COM3 which compares a voltage of the sense bit line. SBL2B with the restriction voltage VBLR, and an NMOS transistor N11 which is responsive to the output of the comparator COM3 to restrict the voltage of the sense bit line SBL2B to not exceed the restriction voltage VBLR.

The sense amplifier SA is enabled by the sense enable signal SEN, and generates voltages corresponding currents Ic and Icb from the sense bit lines SBL2 and SBL2B. The voltages are compared and a comparison result is output as a logic value at node "a" of FIG. 5. For example, if a floating body transistor capacitorless memory cell (MC) connected to the sense bit line SBL2 is "1", and the complementary transistor cell (MCB) connected to the sense bit line SBL2B is "0", the current Ic will be larger than the current Icb. This is because the threshold voltage of transistor cell MC is less than the threshold voltage of the complementary transistor cell MC. In this case, a logic value voltage of "0" is applied to node "a".

The latch circuit LA includes inverters 13 and 14 which are driven by supply voltages V1 and V2, and functions to drive the latch node "b" to an opposite logic level as the latch node "a". The supply voltage V1 is a positive voltage utilized to write data "1" in one of the complementary transistors cells MC and MCB, and the supply voltage V2 is a negative voltage utilized to write data "0" in the other of the complementary transistor cells MC. See, for example, the drain voltage Vd values for write "1" and write "0" of previously discussed Table 1. Given those examples, V1 would be about 1.5V, and V2 would be about −1.5V.

The write back gate WBG includes an NMOS transistor N12 connected between node "a" and the sense bit line SBL2B, and an NMOS transistor N13 connected between node "b" and the sense bit line SBL2. The write back gate WBG is enabled in a write operation by the write back signal WB (from the control signal generator 30 of FIG. 3) to transfer data from the nodes "a" and "b" to the sense bit lines SBL2B and SBL2, respectively.

The column selection gate CSG includes an NMOS transistor N14 connected between node "a" and the data line D2B, and an NMOS transistor N15 connected between node "b" and the data line D2. The column selection gate WBG is enabled in read and write operations by the column select signal CSL (from the column decoder 26 of FIG. 3) to transfer data of the nodes "a" and "b" to and from the data lines D2B and D2, respectively.

Figure 6:
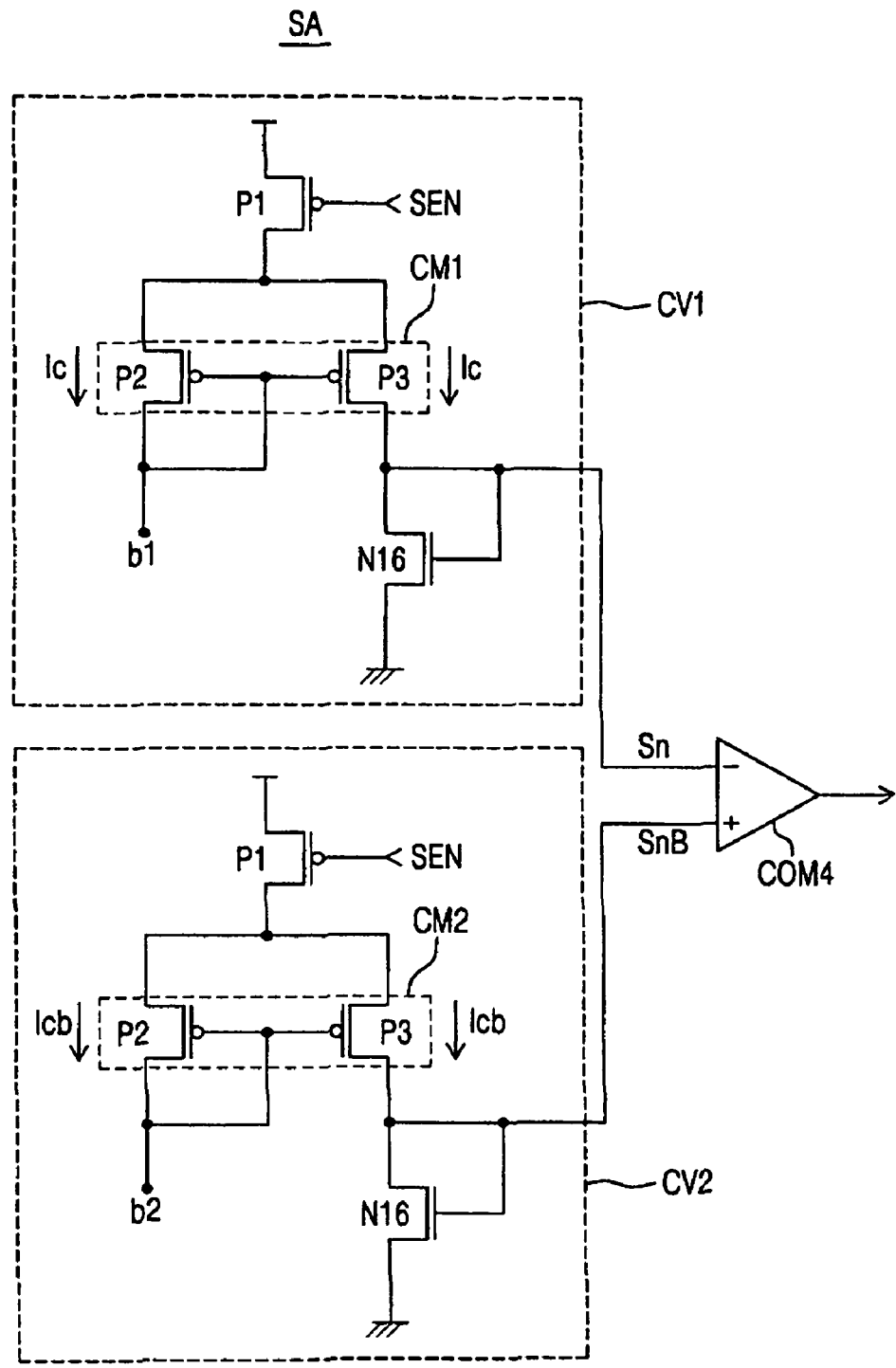
FIG. 6 is a circuit diagram of a sense amplifier according to an embodiment of the present invention.

FIG. 6 is a circuit diagram illustrating an example of the sense amplifier SA of FIG. 5. As shown, the sense amplifier SA includes voltage converters CV1 and CV2, and a comparator COM4. Node "b1" of the voltage converter CV1 is connected to the level limiter LM1 of FIG. 5, and node "b2" of the voltage converter CV2 is connected to the level limiter LM2 of FIG. 5.

Each of the voltage converters CV1 and CV2 includes a PMOS transistor P1 which functions as a current source enabled by the sense enable signal SEN, PMOS transistors P2 and P3 which function as a current mirror, and an NMOS transistor N16 which functions as a diode. As one skilled in the art will appreciate, the sense bit line currents Ic and Icb are reflected as voltages at the respective inputs Sn and SnB of the comparator COM4. The comparator COM4 outputs a comparison result (logic "1" or "0") to node "a" of FIG. 5 as described previously.

An operation of the memory device of FIGS. 3-6 will now be described. In particular, an "active" operation will be described first in which a word line WL is activated and bit sense lines SBL1 and SBL2 are selected. The active operation is executed prior to execution of a write or read operation. Then, the write and read operations will be described in turn.

In the active operation, the row decoder 24 actives (to HIGH) one of the word lines WL in response to the active command ACT and the first row address signal RA1. Also, the bit line selection signal generator 28 activates one of the bit line selection signals BS<1:k/2> in response to the active command ACT and the second row address RA2. As a result, the even bit line selectors 20-1 connect one of the even numbered-bit line pairs BL/BLB to the sense bit lines SBL2 and SBL2B, and the odd bit line selectors 20-2 connect one of the odd numbered bit line pairs BL/BLB to the sense bit lines SBL1 and SBL1B. The control signal generator 30 activates the sense enable signal SEN and the write back signal WB. In response to the activated sense enable signal SEN, the sense amplifier SA in each sense block 22-1 and 22-2 is enabled, whereby current differences between selected sense bit line pairs SBL/SBLB are amplified and represented as complementary voltages on nodes "a" and "b" of the latch circuit LA. In response to the activated write back signal WB, the sense blocks 22-1 and 22-2 restore the complementary voltages to the selected sense bit line pairs SBL/SBLB. In this manner, a refresh operation is conducted.

In a write operation, the command decoder 32 decodes a write command WR, and the column decoder 26 activates one of the column select lines CSL<1:m> in response to the write command WR and a column address CA. As a result, the corresponding column select gates CSG are opened, and complementary write data on the data lines D1/D1B and D2/D2B are transferred to the nodes "a" and "b" of the latches LA of the sense blocks 22-1 and 22-2 connected to the activated select lines CSL. In addition, the write back signal WB is enabled to transfer the complementary write data from the "a" and "b" of the latches LA of the sense blocks 22-1 and 22-2 to the selected sense bit line pairs SBL/SBLB.

For example, when data "1" is to be written into a selected unit memory cell connected to an odd numbered bit line pair BL/BLB, a HIGH voltage is applied to data line D1 and a LOW voltage is applied to data line D1B. As such, a HIGH voltage is applied to node "b" of the corresponding latch LA, and a LOW voltage is applied to the node "a" of the corresponding latch LA. The supply voltage V1 which may be greater than HIGH voltage is thus applied to the sense bit line SBL1, and the supply voltage V2 which may be less than the LOW voltage is applied to the sense bit line SBL1B. As such, floating body transistor capacitorless memory cell MC connected to the sense bit line SBL1 stores data "1", and the floating body transistor capacitorless memory cell MC connected to the sense bit line SBL1B stores data "0". In the example of this embodiment, these complementary data represent data "1" in the unit memory cell.

In a read operation, the command decoder 32 decodes a read command RD, and the column decoder 26 activates one of column select lines CSL<1:m> in response to the read command RD and the column address CA. As a result, the corresponding column select gates CSG are opened, and complementary read data is transferred to the data lines D1/D1B and D2/D2B from the nodes "a" and "b" of the latches LA of the sense blocks 22-1 and 22-2 connected to the activated select line CSL.

In the embodiment described above, complementary floating body transistor capacitorless memory cells are utilized to define each unit memory cell. As such, the embodiment offer the advantage of a high density capacitorless memory cell structure, while at the same time avoiding the need for reference (or dummy cells), reference current generators, and other conventional circuitry needed to read the logic values of the transistor cells. Also, by avoiding the provision of reference cells, processing time is not expended in refreshing the reference cells.

In the embodiment described above in connection with FIGS. 3 through 6, the data lines DL1/DLB1 and DL2/DLB2 are each used to both read and write data from and to the complementary floating body transistor capacitorless memory cells. An alternative embodiment will now be described with reference to FIGS. 7 and 8 in which separate read and write data lines are provided.

Figure 7:
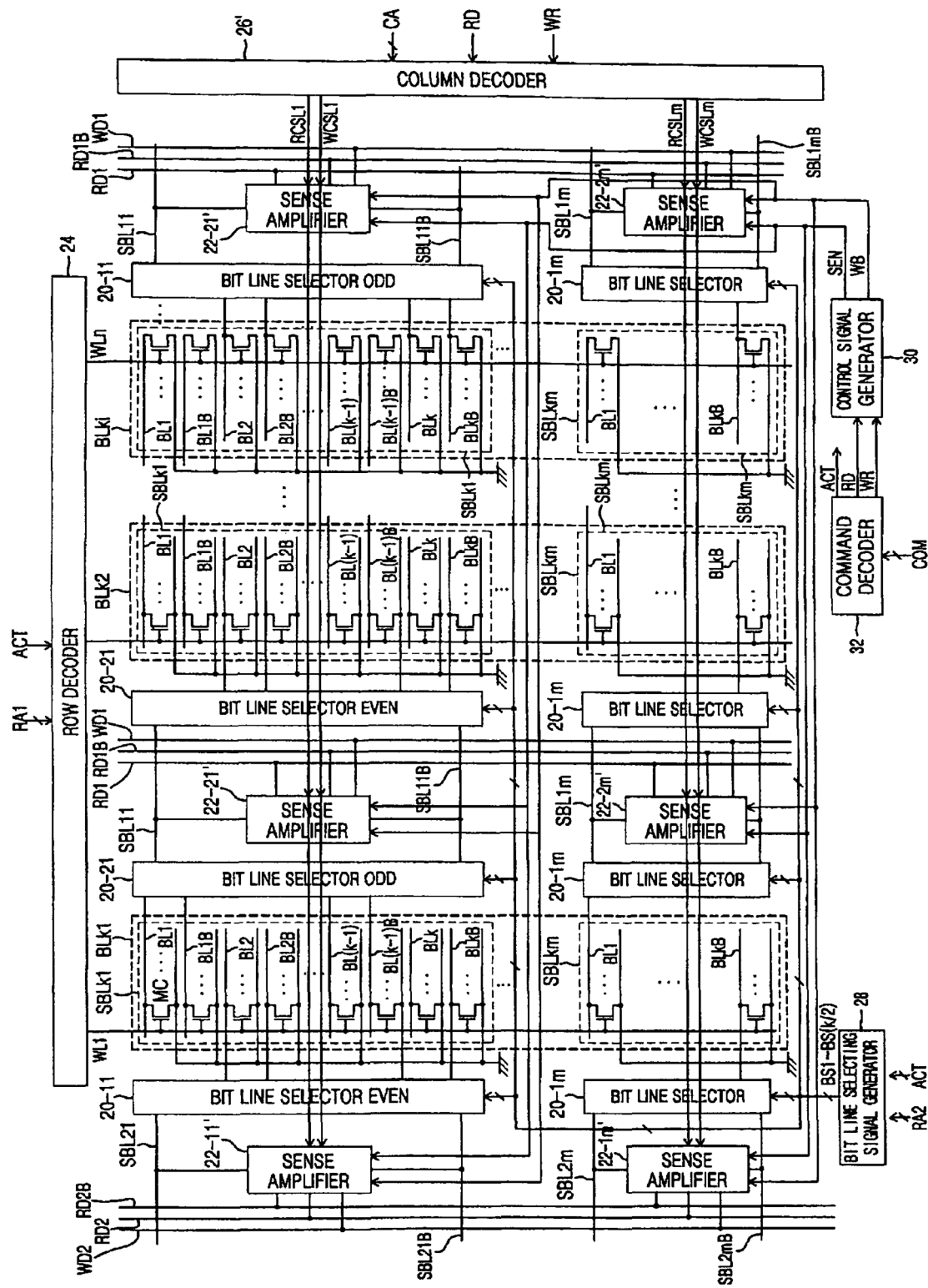
FIG. 7 is a block diagram of a floating body transistor capacitorless memory cell memory device according to another embodiment of the present invention.

FIG. 7 is a block diagram of a memory device according to another embodiment of the present invention. FIG. 7 is the same as FIG. 3 except that (a) FIG. 7 illustrates multiple memory blocks BLK<1:i> and the circuitry associated therewith, (b) FIG. 7 illustrates a different data line structure, namely, read data lines RD1/RD1B and RD2/RD2B, and write data lines WD1 and WD2, and (c) the column selector 26' of FIG. 7 includes separate read column select lines RCSL<1:m> and write column select lines WCSL<1:m>.

Except as discussed in more detail below, the embodiment of FIG. 7 is similar to the embodiment of FIG. 3. Like elements are denoted by like reference numbers in the two figures, and a detailed description of commonalities between the two embodiments is omitted below to avoid redundancy.

Referring to FIG. 7, the memory device includes sense blocks 22-1<1:m>' and sense blocks 22-2'<1:m> located on opposites sides of each memory block BLK<1:i>. As with the embodiment of FIG. 3, the sense blocks 22-1<1:m>' are connected to corresponding even bit line selectors 20-1<1:m>, and the sense blocks 22-2<1:m>' are connected to corresponding odd bit line selectors 20-2<1:m>. Also, unlike the embodiment of FIG. 3, the sense blocks 22-1<1:m>' are connected to read data lines RD2/RD2B and a write data line WD2, and the sense blocks 22-2<1:m>' are connected to read data lines RD1/RD1B and write data line WD1.

Figure 8:
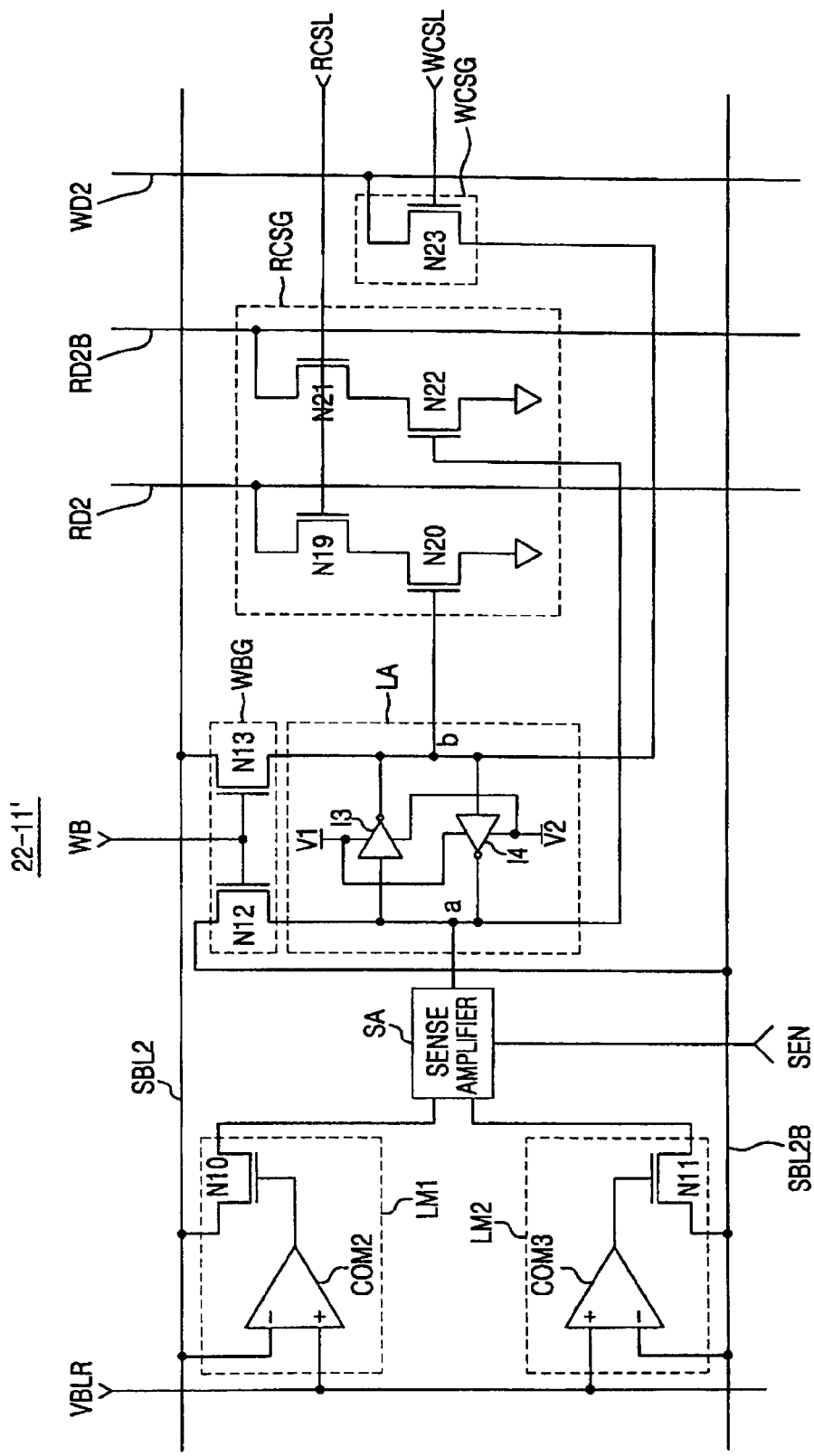
FIG. 8 is a circuit diagram of a sense block according to another embodiment of the present invention.

FIG. 8 is a circuit diagram showing an example of the sense block 22-11' illustrated in FIG. 7. The remaining sense blocks sense block 22-1<2:m>' and 22-2<1:m>' of each memory block BLK are similarly configured.

Referring to FIG. 8, the sense block 22-11' includes level limiters LM1 and LM2, a sense amplifier SA, a latch circuit LA, and a write back gate WBG. These elements are similar to the like-numbered elements of previously described FIG. 5.

In addition, the sense block 22-11' includes a read column select gate RCSG and a write column select gate WCSG.

The read column select gate RCSG includes NMOS transistors N19 and N20 connected between the read data line RD2 and a reference potential (e.g. ground), and NMOS transistors N21 and N22 connected between the read data line RD2B and the reference potential. The NMOS transistors N19 and N21 are gated to the read column select line RCSL. The NMOS transistor N20 is gated to the node "b" of the latch circuit LA, and the NMOS transistor N22 is gated to the node "a" of the latch circuit LA.

The write column select gate WCSG includes an NMOS transistor N23 connected between the write data line WD2 and the node "b" of the latch circuit LA. The NMOS transistor N23 is gated to the write column select line WCSL.

An operation of the memory device of FIGS. 7-8 will now be described.

In the active operation, the row decoder 24 actives (to HIGH) one of the word lines WL in response to the active command ACT and the first row address signal RA1. Also, the bit line selection signal generator 28 activates one of the bit line selection signals BS<1:k/2> in response to the active command ACT and the second row address RA2. As a result, the even bit line selectors 20-1 connect one of the even numbered bit line pairs BL/BLB to the sense bit lines SBL2 and SBL2B, and the odd bit line selectors 20-2 connect one of the odd numbered bit line pairs BL/BLB to the sense bit lines SBL1 and SBL1B. The control signal generator 30 activates the sense enable signal SEN and the write back signal WB. In response to the activated sense enable signal SEN, the sense amplifier SA in each sense block 22-1<1:m>' and 22-2<1:m>' is enabled, whereby current differences between selected sense bit line pairs SBL/SBLB are amplified and represented as complementary voltages on nodes "a" and "b" of the latch circuit LA. In response to the activated write back signal WB, the sense blocks 22-1<1:m>' and 22-2<1:m>' restore the complementary voltages to the selected sense bit line pairs SBL/SBLB. In this manner, a refresh operation is conducted.

In a write operation, the command decoder 32 decodes a write command WR, and the column decoder 26 activates one of the write column select lines WCSL<1:m> in response to the write command WR and a column address CA. As a result, the corresponding write column select gates WCSG are opened, and write data on the write data lines WD1 and WD2 are transferred to the node "b" of the latch circuits LA of the sense blocks 22-1<1:m>' and 22-2<1:m>' connected to the activated write column select lines WCSL. Complementary data is automatically written to the node "a" by operation of the latch circuit LA. In addition, the write back signal WB is activated to transfer the complementary write data from the "a" and "b" of the latch circuits LA of the sense blocks 22-1<1:m>' and 22-2<1:m>' to the selected sense bit line pairs SBL/SBLB.

In a read operation, the command decoder 32 decodes a read command RD, and the column decoder 26 activates one of the read column select lines RCSL<1:m> in response to the read command RD and the column address CA. As a result, the corresponding read column select gates RCSG are opened, and complementary read data is transferred to the read data lines RD1/RD1B and RD2/RD2B from the nodes "a" and "b" of the latch circuits LA of the sense blocks 22-1<1:m>' and 22-2<1:m>' connected to the activated read column select line RCSL.

Figure 9:
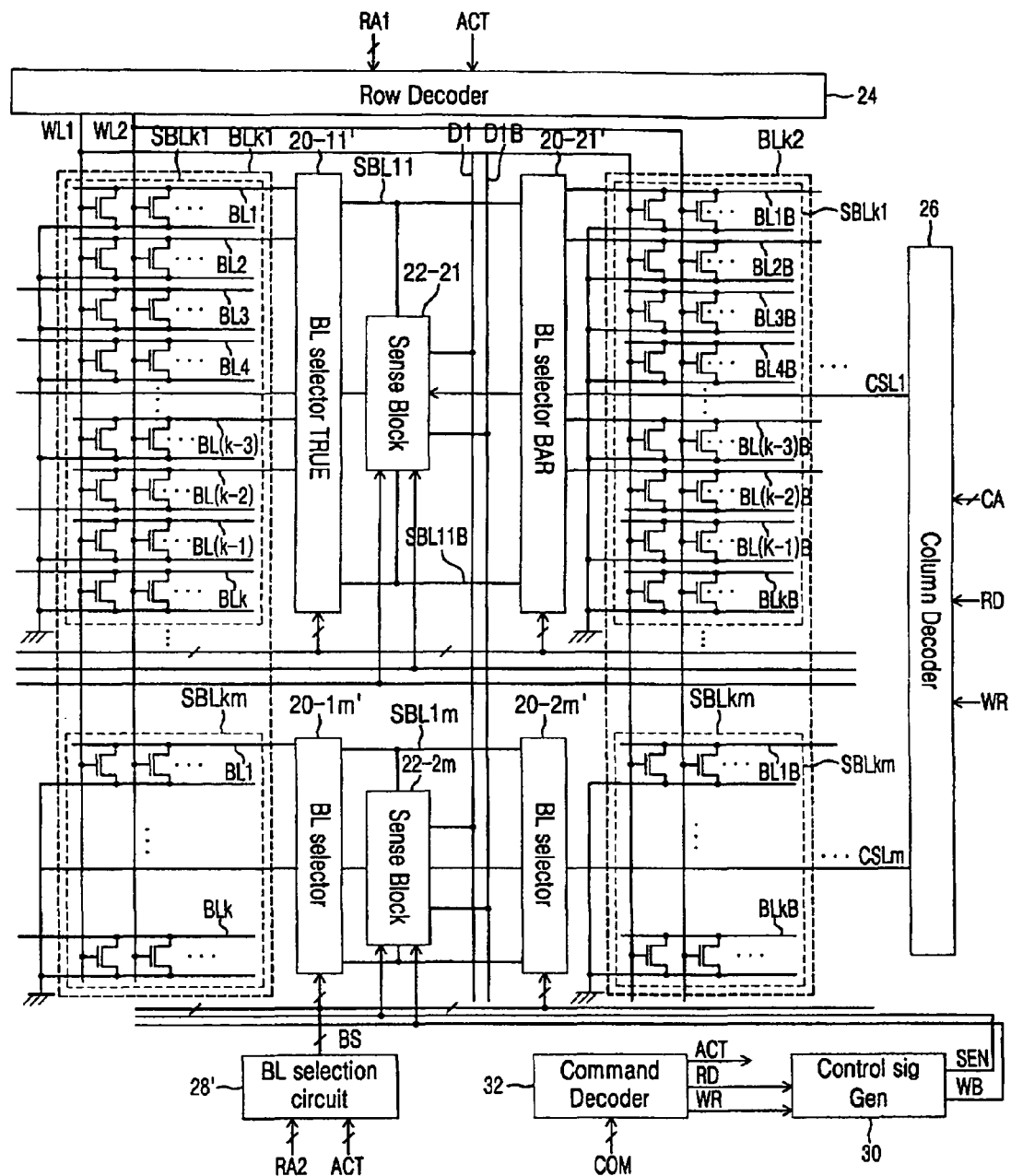
FIG. 9 is a block diagram of a floating body transistor capacitorless memory cell memory device according to an embodiment of the present invention.

In the embodiments described above, the complementary floating body transistor capacitorless memory cells MC forming each unit memory cell are alternately arranged on complementary bit lines BL/BLB within each memory block. FIG. 9 illustrates an alternative "open bit line" configuration in which the complementary floating body transistor capacitorless memory cells are arranged in different memory blocks.

FIG. 9 is a block diagram of floating body transistor capacitorless memory cell memory device according to an embodiment of the present invention.

The memory device of FIG. 9 includes a memory cell array block BLK1 containing a plurality of sub-array blocks SBLK1<1:m>, a memory cell array block BLK2 containing a plurality of sub-array blocks SBLK2<1:m>, a plurality of TRUE and BAR bit line (BL) selectors 20-1<1:m>' and 20-2<1:m>', a plurality of sense blocks 22-2<1:m>, a row decoder 24, a column decoder 26, a bit line selection signal generator 28', a control signal generator 30, and a command decoder 32.

The memory cell array blocks BLK1 and BLK2 together constitute a single block of memory. Although a single memory block is illustrated in FIG. 9 for simplicity, the memory device includes multiple blocks of the same configuration.

Each sub-array block SBLK of the memory cell array block BLK1 contains a plurality of "true" floating body transistor capacitorless memory cells MC, while each sub-array block SBLK of the memory cell array block BLK2 contains a corresponding plurality of "complementary" floating body transistor capacitorless memory cells MC. That is, unlike the previous embodiments, the true and complementary floating body transistor capacitorless memory cells MC which define each unit memory cell are located in the different memory cell array blocks BLK1 and BLK2.

The sub-array blocks SBLK<1:m> of the memory cell array block BLK1 share the same true word line WL1, whereas the sub-array blocks SBLK<1:m> of the memory cell array block BLK2 share the same complementary word line WL2.

Each sub-array block SBLK of the memory cell array block BLK1 includes a plurality of true bit lines BL<1:k>, and each sub-array block SBLK of the memory cell array block BLK2 includes a plurality of complementary bit lines BLB<1:k>. Each bit line BL and its complementary bit line BLB are collectively referred to herein as a "bit line pair". Accordingly, in the example of this embodiment, there are "k" bit line pairs per pair of sub-array blocks SBLK.

As with the previous embodiments, a "unit memory cell" is defined by a first floating body transistor capacitorless memory cell connected between a bit line BL and a reference potential (e.g., ground), and a second floating body transistor capacitorless memory cell connected between a complementary bit line BLB and the reference potential. The unit memory cell stores a logic value as indicated by complementary threshold voltage states of the first and second floating body transistor capacitorless memory cells. That is, each of the unit memory cells includes complementary first and second-floating body transistor capacitor-less memory cells having opposite threshold voltage states. In the example of this embodiment, the floating body transistor capacitorless memory cells are NMOS type transistors.

The complementary first and second floating body transistor capacitor-less memory cells of each unit memory cell are respectively gated to the true word line WL1 and the complementary word line WL2.

The TRUE bit line selectors 20-1<1:m>' and the BAR bit line selectors 20-2<1:m>' are located on opposite sides of the corresponding sense blocks 22-1<1:m>, and between the memory blocks BLK1 and BLK2. Each TRUE bit line selector 20-1' is connected to the true bit lines BL, and each BAR odd bit line selector 20-2 is connected to the complementary bit lines BLB.

Still referring to FIG. 3, the sense blocks 22-l<1:m> are connected to the respective TRUE and BAR bit line selectors 20-1<1:m>' and 20-1<1:m>'. In particular, complementary sense bit lines SBL1<1:m> and SBL1B<1:m> are connected between each TRUE and BAR bit line selector 20-2<1:m>' and 20-1<1:m>' and their corresponding sense block 22-1<1:m>.

Examples of the TRUE and BAR bit line selectors 20-1' and 20-2' and the sense blocks 22-1 and 22-2 will be described in greater detail later herein.

The command decoder 32 generates an active command ACT, a read command RD, and a write command WD in response to a-command signal COM.

The row decoder 24 is responsive to the active command ACT to decode a first row address RA1 to activate corresponding one of the word lines WL.

The bit line selection signal generator 28' is responsive to the active command ACT to decode a second row address RA2 to activate one of bit line selection signals BS<1:k>. The bit line selection signals BS<1:k> are applied to the TRUE and BAR bit line selectors 20-1<1:m>' and 20-2<1:m>' as shown in FIG. 9.

The column decoder 26 is response to the read and write command RD and WR to decode a column address CA to activate a corresponding one or more of the column selection signals CSL<1:m>. The column selection signals CSL<1:m> applied to the respective sense blocks 22-1<1:m> as shown in FIG. 9.

The control signal generator 32 is responsive to the active command ACT to selectively activate a sense amplifier enable signal SEN and a write back signal WB. In particular, the write back signal WB is activated a predetermined time after the sense amplifier enable signal SEN is activated. As shown in FIG. 9, these signals are applied to the sense blocks 22-1<1:m>.

Also depicted in FIG. 9 are complementary data lines D1 and D1B are connected to the sense blocks 22-2<1:m.

An example of the TRUE and BAR bit line selectors 20-1' and 20-2' of FIG. 9 will be described next with reference to FIGS. 10A and 10B. In particular, FIG. 10A is a circuit diagram showing an example of a TRUE bit line selector 20-1', and FIG. 10B is a circuit diagram showing an example of a BAR bit line selector 20-2'.

Figure 10A:
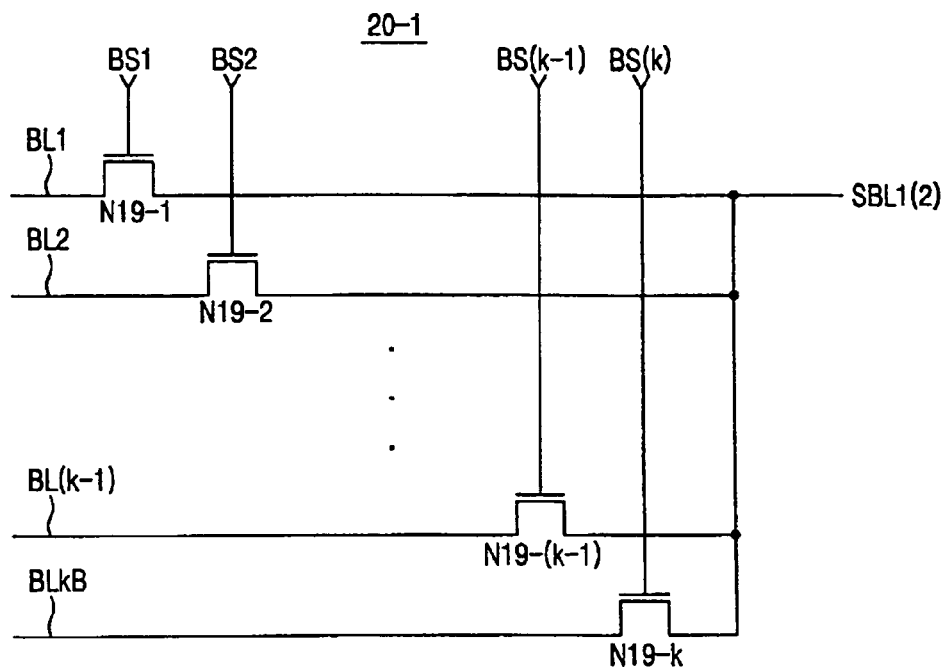
FIGS. 10A and 10B are circuit diagrams of true and bar bit line selectors, respectively, according to other embodiments of the present invention.
Figure 10B:
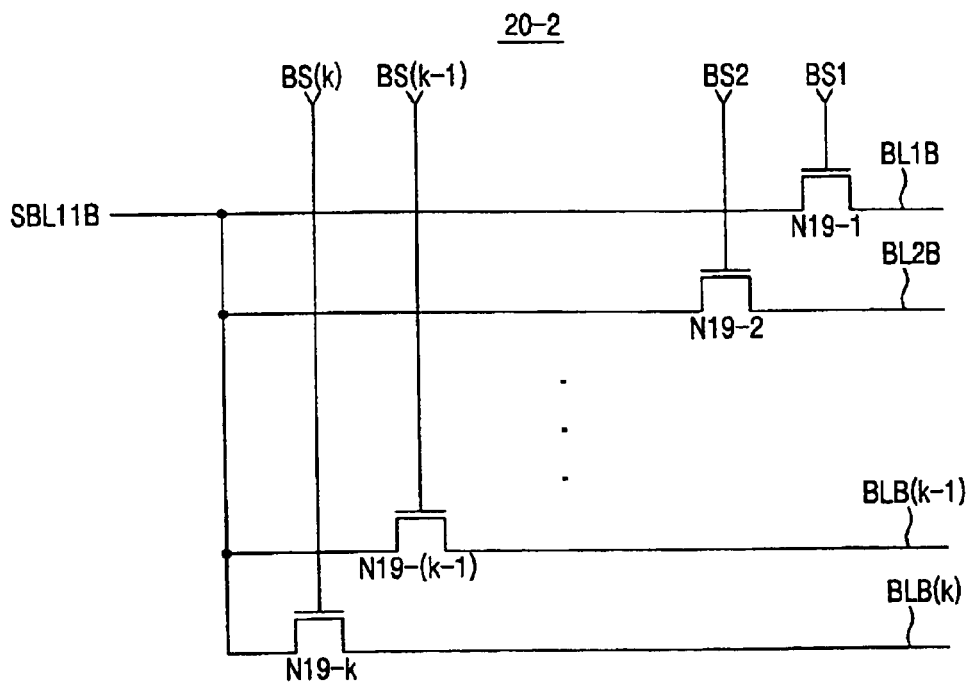

As shown in FIG. 10A, the TRUE bit line selector 20-1 of this example includes NMOS transistor N19-<1:k> connected between respective true bit line pairs BL<1:k> and the true sense bit line SBL. The NMOS transistor N19-<1:k> are respectively gated to the bit line selection signals BS<1:k> generated by the bit line selection signal generator 28'. The TRUE bit line selector 20-1 is responsive to the bit line selection signals BS<1:k> to selectively connect any one of the true bit lines BL<1:k> to the true sense bit lines SBL.

The BAR bit line selector 20-2 of this example includes NMOS transistor N19-<1:k> connected between respective complementary bit line pairs BLB<1:k> and the complementary sense bit line SBLB. The NMOS transistor N19-<1:k> are respectively gated to the bit line selection signals BS<1:k> generated by the bit line selection signal generator 28'. The BAR bit line selector 20-21 is responsive to the bit line selection signals BS<1:k> to selectively connect any one of the complementary bit lines BLB<1:k> to the complementary sense bit lines SBLB.

The sense blocks 22-1<1:m> may be configured in the same manner discussed previously in connection with FIGS. 5 and 6.

An operation of the memory device of FIGS. 9, 10A and 10B will now be described.

In the active operation, the row decoder 24 activates (to HIGH) one of the word lines WL in response to the active command ACT and the first row address signal RA1. Also, the bit line selection signal generator 28 activates one of the bit line selection signals BS<1:k> in response to the active command ACT and the second row address RA2. As a result, the TRUE bit line selectors 20-1 connect one of the true bit line BL to a true sense bit line SBL, and the BAR bit line selectors 20-2 connect a corresponding one of the complementary bit lines BLB to a complementary sense bit lines SBL. The control signal generator 30 activates the sense enable signal SEN and the write back signal WB. In response to the activated sense enable signal SEN, the sense amplifier SA in each sense block 22-1 is enabled, whereby current differences between selected sense bit line pairs SBL/SBLB are amplified and represented as complementary voltages on nodes "a" and "b" of the latch circuit LA (see FIG. 5). In response to the activated write back signal WB, the sense blocks 22-1 restore the complementary voltages to the selected sense bit line pairs SBL/SBLB. In this manner, a refresh operation is conducted.

In a write operation, the command decoder 32 decodes a write command WR, and the column decoder 26 activates one of the column select lines CSL<1:m> in response to the write command WR and a column address CA. As a result, the corresponding column select gates CSG are opened (see FIG. 5), and complementary write data on the data lines D1/D1B are-transferred to the nodes "a" and "b" of the latches LA of the sense blocks 22-1 connected to the activated select lines CSL. In addition, the write back signal WB is enabled to transfer the complementary write data from the "a" and "b" of the latches LA of the sense blocks 22-1 to the selected sense bit line pairs SBL/SBLB.

In a read operation, the command decoder 32 decodes a read command RD, and the column decoder 26 activates one of column select lines CSL<1:m> in response to the read command RD and the column address CA. As a result, the corresponding column select gates CSG are opened, and complementary read data is transferred to the data lines D1/D1B from the nodes "a" and "b" of the latches LA of the sense blocks 22-1 connected to the activated select line CSL.

Another embodiment of the present invention will now be described with reference to the circuit diagram of FIG. 11. The embodiment of FIG. 11 is a modification of the embodiment of FIG. 9 in the same way that the embodiment of FIG. 7 is a modification of the embodiment of FIG. 3.

Figure 11:
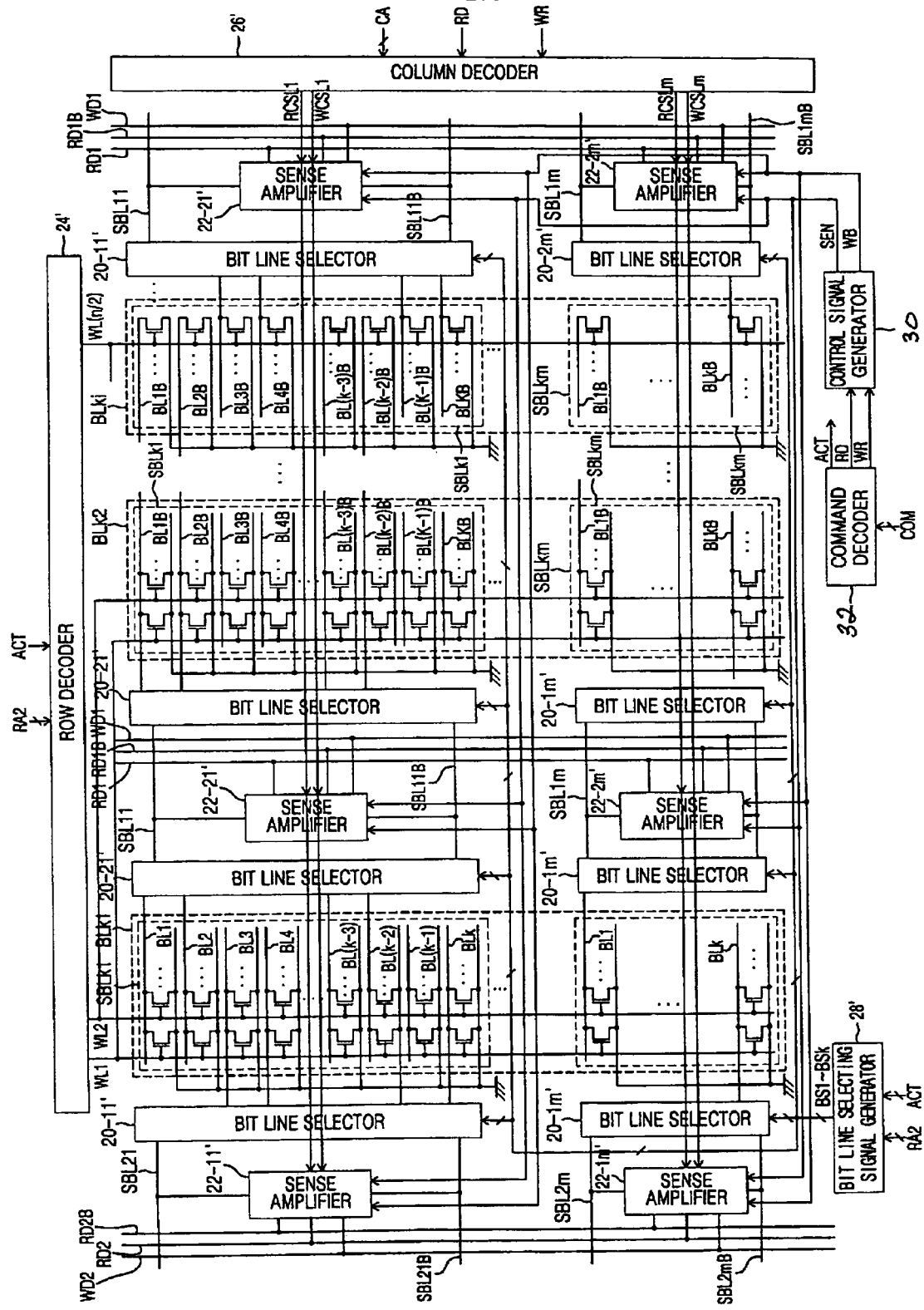
FIG. 11 is a block diagram of a floating body transistor capacitorless memory cell memory device according to an embodiment of the present invention.

That is, FIG. 11 is the same as FIG. 9 except that (a) FIG. 11 illustrates multiple memory block pairs BLK<1:i> and the circuitry associated therewith, (b) FIG. 11 illustrates a different data line structure, namely, read data lines RD1/RD1B and a write data line WD1, and (c) the column selector 26' of FIG. 11 includes separate read column select lines RCSL<1:m> and write column select lines WCSL<1:m>.

Except as discussed in more below, the embodiment of FIG. 11 is similar to the embodiment of FIG. 9. Like elements are denoted by like reference numbers in the two figures, and a detailed description of commonalities between the two embodiments is omitted below to avoid redundancy.

Referring to FIG. 11, the memory device includes sense blocks 22-2<1:m>' located between corresponding TRUE and BAR bit line selectors 20-1<1:m>' and 20-2<1:m>'. As with the embodiment of FIG. 9, the sense block 22-2<1:m>' are connected to corresponding true sense bit lines SBL and complementary sense bit lines SBLB. Also, unlike the embodiment of FIG. 9, the sense blocks 22-2<1:m>' are connected to read data lines RD1 and RD1B and to write data line WD1.

The sense blocks 22-2<1:m> of FIG. 11 may be constructed in the same manner as described previously in connection with FIG. 8.

An operation of the memory device of FIG. 11 will now be described.

In the active operation, the row decoder 24 activates (to HIGH) one of the word lines WL in response to the active command ACT and the first row address signal RA1. Also, the bit line selection signal generator 28' activates one of the bit line selection signals BS<1:k> in response to the active command ACT and the second row address RA2. As a result, the TRUE bit line selectors 20-1' connect one of the true bit line BL to a true sense bit line SBL, and the BAR bit line selectors 20-2' connect a corresponding one of the complementary bit lines BLB to a complementary sense bit1ines SBL. The control signal generator 30 activates the sense enable signal SEN and the write back signal WB. In response to the activated sense enable signal SEN, the sense amplifier SA in each sense block 22-2 is enabled, whereby current differences between selected sense bit line pairs SBL/SBLB are amplified and represented as complementary voltages on nodes "a" and "b" of the latch circuit LA (see FIG. 5). In response to the activated write back signal WB, the sense blocks 22-2 restore the complementary voltages to the selected sense bit line pairs SBL/SBLB. In this manner, a refresh operation is conducted.

In a write operation, the command decoder 32 decodes a write command WR, and the column decoder 26 activates one of the write column select lines WCSL<1:m> in response to the write command WR and a column address CA. As a result, the corresponding write column select gates WCSG are opened (see FIG. 8), and a write data on the write data line WD1 is transferred to the node "b" of the latch circuits LA of the sense blocks 22-2 connected to the activated write column select lines CSL. Complementary write data is automatically applied to the node "a" by operation of the latch circuit LA. In addition, the write back signal WB is activated to transfer the complementary write data from the "a" and "b" of the latches LA of the sense blocks 22-2 to the selected sense bit line pairs SBL/SBLB.

In a read operation, the command decoder 32 decodes a read command RD, and the column decoder 26 activates one of read column select lines RCSL<1:m> in response to the read command RD and the column address CA. As a result, the corresponding read column select gates CSG are opened (see FIG. 8), and complementary read data is transferred to the read data lines RD1/RD1B from the nodes "a" and "b" of the latch circuits LA of the sense blocks 22-2 connected to the activated read column select line RCSL.

The exemplary embodiments described above are partially characterized by the utilization of complementary floating body transistor capacitorless memory cells to define each unit memory cell of a memory device, such as a DRAM device. As such, the embodiments offer the advantage of a high density capacitorless memory cell structure, while at the same time avoiding the need for reference (or dummy cells), reference current generators, and other conventional circuitry needed to read the logic values of the transistor cells. Also, by avoiding the provision of reference cells, processing time is not expended in refreshing the reference cells.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as-well as other embodiments, are intended to be included within the scope of the appended claims. The present invention is defined by the following claims, with equivalents of the claims to be included therein.

What is claimed is:

1. A semiconductor memory device comprising a memory cell array which includes sub memory cell array blocks, each sub memory cell array block comprising a plurality of unit memory cells between a plurality of word lines and a plurality of bit line pairs, each unit memory cell comprising a first memory cell having a floating body connected between a corresponding word line among the plurality of word lines and a bit line of a corresponding bit line pair among the plurality of bit line pairs and a second memory cell having a floating body connected between the corresponding word line and a complementary bit line of the corresponding bit line pair;

a bit line selecting portion comprising bit line selectors, each bit line selector connected between each sub memory cell array block and corresponding sense bit line pair among a plurality of sense bit line pairs, each bit line selector connecting one bit line pair among the plurality of bit line pairs to the corresponding sense bit line pair in response to bit line selecting signals;

at least one data line including first and second complementary data lines; and a sensing portion comprising a plurality of sensing circuits, each sensing circuit connected between the corresponding sense bit line pair and at least one data line, wherein the first memory cell and the second memory cell are volatile memory cells, the first memory cell of the unit memory cell stores data and the second memory cell of the unit memory cell stores complementary data in a write operation, and wherein the sensing circuit comprises a column selecting gate transmitting data applied through the first and second complementary data lines in response to a corresponding column selection signal during a read operation and the write operation, first and second voltage limiters limiting a voltage level of each of the corresponding sense bit lines during the read operation, a sensing amplifying circuit generating first and second voltages corresponding to currents flowing through the first and second voltage limiters and sensing and amplifying a voltage difference of the first and second voltages to generate sensing data during the read operation, a latch latching the data transmitted through the column selecting gate during the write operation and latching the sensing data during the read operation, and a write back gate transmitting the data latched in the latch into the corresponding sense bit line pair in response to a write back signal.

2. The semiconductor memory device of claim 1, wherein the complementary first and second floating body transistor capacitor-less memory cells of the unit memory cells are alternately arranged in a same memory block.

3. The semiconductor memory device of claim 1, wherein the complementary first and second floating body transistor capacitor-less memory cells of the unit memory cells are arranged in different memory blocks.

4. The semiconductor memory device of claim 1, wherein a logic value of each unit memory cell is defined by a difference in threshold voltages of the complementary first and second floating body transistor capacitor-less memory cells.

* * * * *